United States Patent [19]

Yamano et al.

[11] Patent Number: 4,542,578
[45] Date of Patent: Sep. 24, 1985

[54] METHOD OF MANUFACTURING PHOTOVOLTAIC DEVICE

[75] Inventors: Masaru Yamano; Isao Nagaoka, both of Hirakata; Yukinori Kuwano, Katano; Hiroshi Kawada; Souichi Sakai, both of Hirakata, all of Japan

[73] Assignee: Sanyo Electric Co., Ltd., Japan

[21] Appl. No.: 589,886

[22] Filed: Mar. 15, 1984

[30] Foreign Application Priority Data

Mar. 18, 1983 [JP] Japan .................................. 58-46387

[51] Int. Cl.$^4$ ........................................... H01L 31/18
[52] U.S. Cl. ...................................... 29/572; 29/578; 29/580; 29/591; 156/643; 156/657; 156/663; 136/244; 136/258; 204/192 E
[58] Field of Search ................. 29/572, 578, 580, 591; 204/192 E; 156/643, 657, 663; 136/244, 249 MS, 258 AM, 260; 427/74

[56] References Cited

U.S. PATENT DOCUMENTS 4,281,208 7/1981 Kuwano et al. ..................... 136/249
4,292,092 9/1981 Hanak ................................. 148/1.5

Primary Examiner—Aaron Weisstuch
Attorney, Agent, or Firm—Darby & Darby

[57] ABSTRACT

Mutually spaced apart TCO film portions are formed on a glass substrate. An amorphous silicon film of PIN junction type is formed to cover these TCO film portions, and an aluminum film is formed thereon. The aluminum film in the vicinity of the gap between adjacent TCO film portions is removed by means of a laser beam, and the amorphous silicon film is removed by reactive plasma etching using the aluminum film as a mask to thereby expose portions of the TCO film. An aluminum-titanium film is formed over the aluminum film and the exposed portions of the TCO film. The aluminum-titanium film is separated by means of a laser beam to form a plurality of photoelectric converting regions. The photoelectric converting regions thus formed on the glass substrate are connected in series.

10 Claims, 8 Drawing Figures

METHOD OF MANUFACTURING PHOTOVOLTAIC DEVICE

BACKGROUND OF THE INVENTION

1. Field of the Invention

The present invention relates to a method of manufacturing a photovoltaic device. More specifically, the present invention relates to a method of manufacturing a photovoltaic device wherein a plurality of photoelectric converting regions are formed on a substrate and the individual photoelectric converting regions are connected in series.

2. Description of the Prior Art

FIG. 1 is a sectional view showing one example of a conventional photovoltaic device constituting the background of the present invention. Such a photovoltaic device is disclosed in, for example, U.S. Pat. No. 4,281,208 issued on July 28, 1981. The conventional photovoltaic device shown in FIG. 1 will be briefly described to the extent required for an understanding of this invention.

On a glass substrate 1 a plurality of (three in the illustrated case) photoelectric converting regions are formed comprising transparent conductive film portions 2a, 2b, and 2c. On each transparent conductive film portions 2a, 2b, and 2c there are formed overlying semiconductor film portions 3a, 3b, and 3c consisting of amorphous silicon, and respective back-side film electrodes 4a, 4b, and 4c extending to the adjacent transparent conductive film portions respectively. The semiconductor film portions 3a, 3b, and 3c each contain at least one PIN junction parallel to their surface. When the incident light impinges upon the semiconductor film portions 3a, 3b, and 3c through the glass substrate 1 and the transparent conductive film portions 2a, 2b, and 2c, photovoltaic power is generated at each PIN junction. The photovoltaic power generated by the semiconductor film portions 3a, 3b, and 3c is outputted in series fashion since the back-side film electrodes 4a, 4b, and 4c are connected with the respective adjacent transparent conductive film portions.

Various approaches have been taken for improving the energy efficiency of the conventional photovoltaic device as shown in FIG. 1. In order to improve the energy efficiency of such a device, it is essential to improve its light utilization factor. Thus the proportion of the total area of the semiconductor film portions 3a, 3b, 3c . . . actually contributing to electricity generation to the overall area of the photovoltaic device exposed to light has to be increased as much as possible. In such a photovoltaic device, however, there exist among the semiconductor film portions 3a, 3b, and 3c regions without semiconductor film, which are indicated by the reference symbol NON in FIG. 1, and this makes the total area of semiconductor film relatively small compared with the overall area of the device exposed to light. Hence, in order to improve the light utilization factor of the device, it is essential to minimize the distances between the individual photoelectric converting regions. The extent to which such distances can be reduced depends on the working precision for the individual film portions. Generally, therefore, a photo-etching technique which is known for its super-high working precision is employed.

In the case where such photo-etching technique is used, the working procedure is as follows, referring to FIG. 1. A transparent film is formed over the entire surface of the glass substrate 1, etching is then performed with a photoresist film formed for masking the areas corresponding to the transparent conductive film portions 2a, 2b, and 2c. After etching, the photo-resist film is removed, and thus the transparent conductive film portions 2a, 2b, and 2c are formed equally spaced from one another. For formation of the semiconductor film portions 3a, 3b, and 3c, also, the respective steps of forming the semiconductor film and the photo-resist film for masking, etching, and removal of the photo-resist film are required. Such photo-etching technique is indeed superior in the working precision attainable, but is likely to cause defects in the semiconductor film due to e.g. pinholes possibly occurring in the photo-resist film for masking, i.e. for defining the etching pattern or peeling of the same along its edges.

Another method of forming the respective film portions without the use of photo-resist is disclosed in, for example, U.S. Pat. No. 4,292,092, issued on Sept. 29, 1981, which features the use of a laser beam. As is disclosed therein, the laser beam is used for cutting the film in the necessary pattern; however, care is required lest the laser beam should damage other film underneath, if any.

In the above U.S. Pat. No. 4,292,092, therefore, it is proposed to select proper laser output power or pulse frequency for each film to be cut. As the experiments made by the present inventors show however, it is extremely difficult to select the laser output power or pulse frequency such that the laser beam is effective only for a particular film. When, for instance, the back-side electrodes 4a, 4b, 4c . . . are formed of aluminum, it is necessary to remove excessive aluminum by melting by laser beam, and when the laser output power is raised to a level high enough for melting aluminum, the amorphous semiconductor film underneath or in the vicinity thereof is bound to be heated to a very high temperature sufficient to be damaged thereby. This is inevitable even if the pulse frequency is selected properly. Damage of the amorphous semiconductor film is of grave consequence for a photovoltaic device. The thickness of the amorphous semiconductor film in photovoltaic devices of this type is normally less than 1 $\mu$m, and considering that the amorphous semiconductor film is only up to several $\mu$m thick even if a tandem junction is formed as disclosed in U.S. Pat. No. 4,292,092, the manufacturing method disclosed in this U.S. patent is not necessarily optimum.

SUMMARY OF THE INVENTION

It is, therefore, a principal object of the present invention to provide a novel method of manufacturing photovoltaic devices.

Another object of the present invention is to provide a method of manufacturing photovoltaic devices by the use of an energy-beam such as a laser beam wherein other portions of the devices are not damaged thereby unnecessarily.

In order to accomplish the above-mentioned objects, the manufacturing method of the present invention comprises the steps of forming first spaced apart electrodes on a substrate, forming a semiconductor film covering the entire surfaces of the first electrodes and a second electrode film thereon in this order, cutting the second electrode by the use of an energy-beam such as a laser beam for dividing it into a plurality of portions corresponding to a plurality of photoelectric converting regions with simultaneous removal of unnecessary portions, removing the unmasked portions of the semiconductor film by dry etching using the divided second electrode for masking and electrically connecting portions of the first electrodes exposed thereby with the adjoining portions of the divided second electrode.

According to the present invention, the semiconductor film is to be dry etched with the divided second electrodes as masks; hence there is no risk of the semiconductor film being damaged by the energy-beam. That is, even if the semiconductor film underneath is damaged by the energy-beam used for dividing the second electrode with simultaneous removal of unnecessary portions thereof, the semiconductor film in those portions or areas are next removed by dry etching; hence unlike the method disclosed in the quoted patent, there is no problem resulting from damage of the semiconductor film by the energy-beam. Also, in the method disclosed in the quoted U.S. patent, when the positive regions are scribed by the laser beam, it is possible that the semiconductor material is attached to the surface of the semiconductor forming the active regions to cause formation of pinholes in the back-side electrodes or the second electrodes to be formed on the surface of the active regions. According to the present invention, however, the surface of the semiconductor film is already covered by the second electrode when the latter is cut by the laser beam, hence there is no possibility of spatters landing on the semiconductor film. Moreover, since in this case the second electrode is formed on the semiconductor film immediately after formation thereof to be scribed or otherwise processed thereafter, deposition of dust etc. on the surface of semiconductor film can be prevented very effectively.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
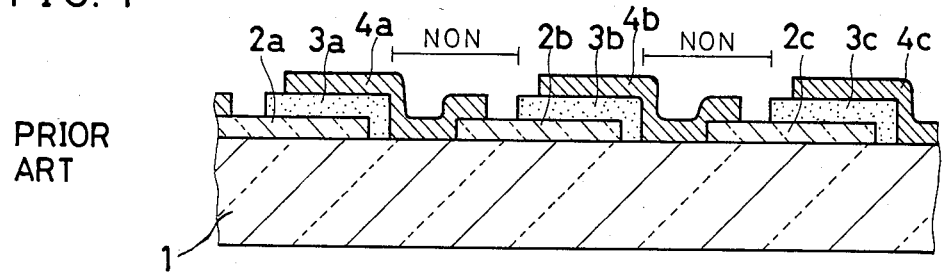
FIG. 1 is a sectional view showing an example of a conventional photovoltaic device constituting the background of the present invention.
Figure 2:
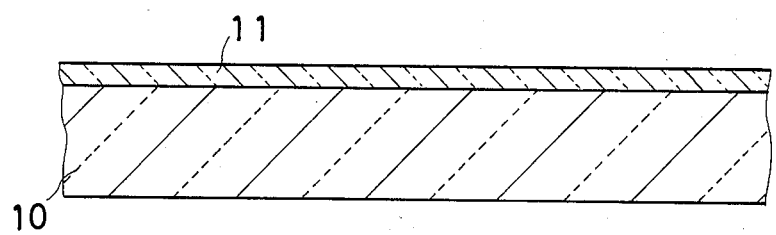
FIGS. 2 through 8 are sectional views showing the successive steps of the process as an embodiment of the present invention.

First, a substrate 10 is prepared consisting of a transparent (or translucent) insulation material 1–3 mm thick such as glass. Then, as shown in FIG. 2, there is formed on the surface of the substrate 10 a transparent conductive film 11 consisting of e.g. tin oxide ($SnO_2$) and having a thickness of e.g. 2,000 Å–5,000 Å. This transparent conductive film 11 serves as a first film electrode or a first electrode. Indium oxide ($In_2O_3$) or ITO (Indium Tin Oxide: $In_2O_3 + SnO_2$) may also be used for the transparent conductive film, and it is also possible to use TCO (Transparent Conductive Oxide) as a single layer or a laminate consisting of layers of ITO and tin oxide.

Figure 3:
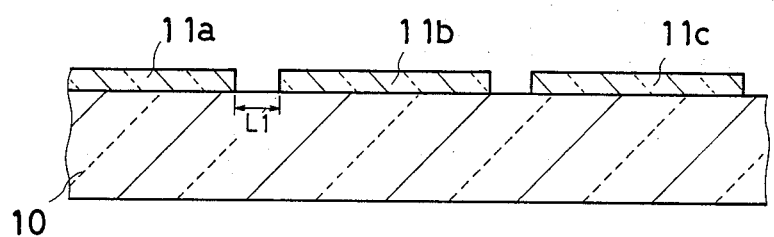

Then, as shown in FIG. 3, the continuous transparent conductive film 11 (FIG. 2) is divided into separate transparent conductive film portions 11a, 11b, and 11c. For that, a width L1 of the transparent conductive film is removed by means of a laser beam. A laser beam suited for this purpose a YAG laser beam 1.06 μm in wavelength, and the width L1 is to be set at approximately 100 μm. If the laser beam is applied to the transparent conductive film 11 at this stage, there is only the transparent substrate 10 underneath, which is seldom damaged by the laser beam as it transmits therethrough. Instead of a laser beam, another energy beam may also be used, such as an election beam or an ion beam.

Figure 4:
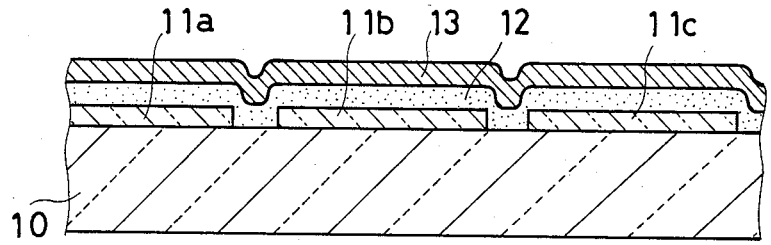

Thereafter, as shown in FIG. 4, a continuous amorphous silicon film 12 is formed to cover the entire surface of the individual transparent conductive film portions 11a, 11b, and 11c. This amorphous silicon film 12 thickness of e.g. 5,000 Å–7,000 Å is formed by glow discharge in the known atmosphere of silane. The method of forming such an amorphous silicon film 12 is disclosed in, for example U.S. Pat. Nos. 4,281,208 and 4,064,521. This amorphous silicon film 12 includes therein at least one PIN junction parallel to its surface. In practice, first P-type amorphous silicon film is formed, and then I type (non-doped layer) and N-type amorphous silicon film portions are formed successively one upon another. For the P-type layer amorphous silicon carbide ($a-Si_xC_{1-x}$) can be used, while for the I-type layer a mixed phase layer of amorphous silicon with microcrystals therein can be used besides amorphous silicon. As an N-type layer, amorphous silicon germanium ($a-Si_xGe_{1-x}$) or amorphous silicon tin ($a-Si_xSn_{1-x}$) can be used. Further, as the semiconductor film 12, a microcrystalline semiconductor or a multi-crystalline semiconductor can also be used besides the above-mentioned amorphous silicon semiconductor. For example, cadmium-based semiconductors such as sintered cadmium sulfide (CdS) and cadmium telluride (CdTe) may as well be used.

On the amorphous silicon film 12 formed as described above, a continuous back-side film electrode 13 of 2,000 Å–1 μm thickness is formed thereover. Since the back-side film electrode 13 is formed immediately over the surface of amorphous silicon film 12 immediately after its formation without intermediate processing thereof, there is no risk of dust or the like being deposited on the surface of amorphous silicon film 12. The back-side film electrode 13 consists of e.g. aluminum. For the material of the back-side film electrode or second electrode 13, however, aluminum alloys (e.g. AlSi), gold (Au), copper (Cu), titanium (Ti), nickel (Ni), indium (In), platinum (Pt), titanium silver (TiAg), chromium (Cr), and the like may also be used. Aluminum is particularly preferred for its moderate price and good reflectivity.

Figure 5:
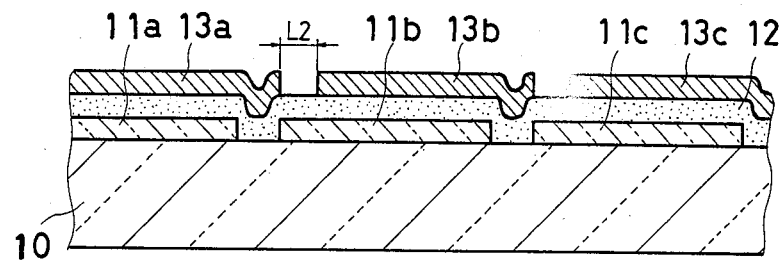

Then, as shown in FIG. 5, strips of width L2 of the back-side film electrode are removed for resultant formation of separate back-side film electrodes 13a, 13b, and 13c corresponding to the individual photoelectric converting regions. For this purpose a laser beam 1.06 μm in wavelength from e.g. YAG laser is used. More particularly, the laser beam having an average output 1.0 watt, pulse frequency of 2 kHz, and 50 mm focal distance of its object lens is used. Besides a laser beam, other energy beams such as an electron beam and an ion beam may also be used. The strip width L2 is approximately 100 μm. If application of the energy beam in the step illustrated in FIG. 5 should cause spattering of material of the back-side film electrode film, there is no risk of the spatters landing on the semiconductor film 12 since the amorphous silicon film 12 is already covered with the back-side film electrode 13.

Figure 6:
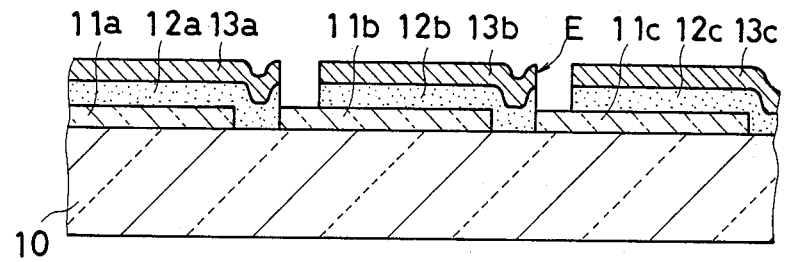

In the step illustrated in FIG. 6, the amorphous silicon film exposed in the strips of width L2 (FIG. 5) is removed by plasma etching with the back-side film electrodes 13a, 13b, and 13c serving as masks. Separate amorphous silicon film portions 12a, 12b, and 12c identical in shape with the back-side film electrodes 13a, 13b, and 13c are thus formed. For this dry etching process either of the two alternatives of plasma etching, i.e., by means of glow discharge or magnetoron discharge, is applicable. Preferably, however, what is called reactive ion etching is applied. It is performed, for instance, by the use of an apparatus of the induction coupling type, at the normal temperature, with a high frequency power source of 13.56 MHz and etching conditions of 96% carbon fluoride ($CF_4$) and 4% oxygen ($O_2$).

Noteworthy here is that etching of the amorphous silicon film 12 is done with the back-side film electrodes 13a, 13b, and 13c previously divided by an energy beam, as masks. That is, even if the energy beam applied to the back-side film electrode should damage the amorphous silicon film underneath, the amorphous silicon film in such damaged area is removed by dry etching in the step of FIG. 6, hence it gives rise to no problems at all. This is why an energy beam can be used for precision removal in the step of FIG. 5.

It is also considered possible by the use of a laser beam to simultaneously remove the aluminum film 13 and amorphous silicon film 12 for obtaining the construction illustrated in FIG. 6. Simultaneous removal of both by the use of laser beam, however, is bound to cause formation of an alloy of aluminum and amorphous silicon. Removal of this alloy requires the use of a laser beam of still higher output power, and the use of such a powerful laser beam possibly causes damage to the transparent conductive film portions 11a, 11b, and 11c. Even if such problem can somehow be precluded, it is extremely difficult to find proper conditions therefor.

Figure 7:
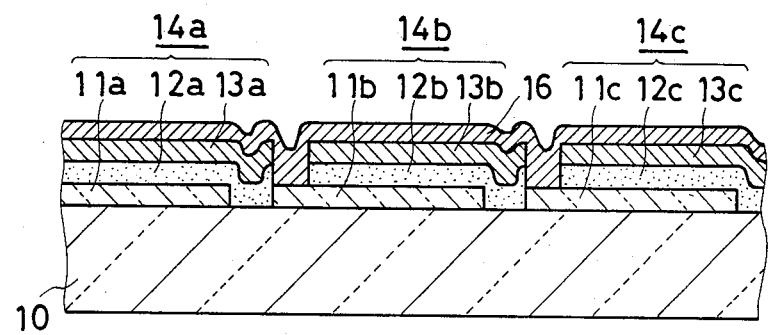

Then in the step of FIG. 7, a connecting film electrode 16 of approximately 1,000 Å–5,000 Å thickness is formed over the back-side film electrodes 13a, 13b, and 13c and the area of the transparent conductive film exposed in the areas corresponding to the strips of width L2 (FIG. 5). The material used for this connecting film electrode 16 should be higher in moisture resistance than the back-side film electrodes 13a, 13b, and 13c. Titanium for example is suitably. It is then possible to protect with this connecting film electrode 16 moisture-induced corrosion of the back-side film electrode. Since, however, this connecting film electrode 16 is to be provided for electrically connecting the adjacent transparent conductive film portions and the back-side film electrodes, it is not essential that it cover the entire surface of the back-side film electrodes 13a, 13b, and 13c.

Figure 8:
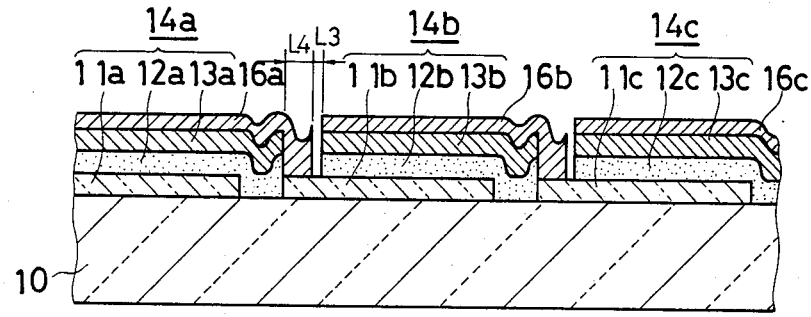

Next, as shown in FIG. 8, strips of width L3 of the connecting film electrode are removed by means of an energy beam such as a laser beam. The laser beam used here is the same as that used for removal of the back-side film electrode, and the width L3 is selected to be approximately 20 μm. The width L4 of the connecting portions between the connecting film electrodes 16a, 16b (extending from the left adjacent photoelectric converting region) and transparent conductive film portions 11b, 11c is approximately 80 μm. Thus, on the substrate 10 the separate photoelectric converting regions 14a, 14b, and 14c are formed, each consisting of the transparent conductive film, amorphous silicon film and back-side film electrode formed one upon another. The photovoltaic power generated in the photoelectric converting regions 14a, 14b, and 14c respectively are added and outputted in series fashion due to the connecting film electrodes 16a, 16b, and 16c.

In the step of FIG. 8 it might be possible that the transparent conductive film 11 is damaged in the areas corresponding to the strips of width L3 by the laser beam used for removing the connecting film electrode. Since connection of the transparent conductive film with the connecting film electrode is then already over, however, the junction is perfectly safe from damage. Even if such damage should result, it is not in the direction of thickness of the transparent conductive film, hence it is of no practical significance.

In the step of FIG. 8, that is, removal of the connecting film electrode, the technique of photo etching may also be used instead of the aforesaid energy beam. That is, the connecting film electrode can also be removed in strips of width L3 by masking the surface thereof with photo-resist except for the strips of width L3 and subsequently dipping the system in an ordinary etching bath. Photo-etching used to be undesirable because possible formation of pinholes in the photo-resist film which was bound to result in defects in the semiconductor film. When, however, it is used for etching the connecting film electrode 16, the semiconductor film portions 12a, 12b, and 12c are already covered by the back-side film electrode portions 13a, 13b, and 13c respectively; hence, even if pinholes should be formed in the photo-resist film covering the connecting film electrode 16, there is no possibility of defects being caused in the semiconductor film. Also, even if a portion of the connecting film electrode should be removed in the course of etching due to pinholes created in the photo-resist film, it has no adverse effect on the collecting function of the back-side film electrodes 13a, 13b, and 13c. Hence, it is possible to use the photo-etching technique for patterning the connecting film electrodes 16a, 16b, and 16c.

The connecting film electrodes 16a, 16b, and 16c may also be formed by vapor deposition by the use of masks. That is, it is feasible to form the connecting film electrodes 16a, 16b, and 16c as shown in FIG. 8 by masking at least the strip of width L3 and vapor depositing the film electrode material in the remaining, exposed areas. Hitherto, the pattern precision of vapor deposition masks is said to be not so high, but it is because there was something to be desired about the precision of deposition amorphous silicon film, this resulting in an increased allowance required for the vapor deposition mask. When the amorphous silicon film is formed on th substrate by glow discharge by the use of masks, the substrate is as hot as 200°–350° C., and the thermally expanded mask cannot fit the substrate closely. The resulting ingress of the reactive gas into the gap gives rise to the so-called oozing out of the film along the edges of the mask, this resulting in the difficulty of precisely patterning the amorphous silicon film. Since the defining of the back-side film electrode portions 13a, 13b, and 13c is made by means of an energy beam as in the aforesaid embodiment, however, the working precision along the edges (indicated by reference symbol E in FIG. 6) is quite high; hence it causes no particular problem even if a masking technique of less than the desired working precision is used for forming the connecting film electrode.

In the above embodiment the arrangement is so chosen that the incident light invariably comes from the side of the substrate 10. This invention is, however, effective even with a photovoltaic device in which the incident light comes from the side of the back-side film electrode 13. In that case the substrate 10 is made of either ceramics or heat-resistant high polymer material such as polyimide and on it are formed metal electrodes corresponding to the transparent conductive film portions 11a, 11b, and 11c, with a semiconductor film formed thereon. A TCO film is formed to constitute the uppermost layer. It will be easily understood that even with a photovoltaic device of such a construction the patterning of the TCO film by means of an energy beam as well the patterning of the semiconductor film by dry etching as described in the above embodiment are similarly applicable.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a photovoltaic device comprising the steps of:
   preparing a substrate having an insulating surface;
   forming on said insulating surface of said substrate a plurality of mutually spaced first electrodes corresponding to a plurality of photoelectric converting regions;
   forming a semiconductor film and a second electrode continuously covering the entire surface of said plurality of first electrodes one upon the other in this order;
   removing portions of said second electrode by means of an energy beam at least in the vicinities of the gap between adjacent said first electrodes so as to divide said second electrodes into a plurality of portions corresponding to said plurality of photoelectric converting regions;
   removing said semiconductor film by dry etching, using said second electrodes as masks, thereby exposing a portion of each of said first electrodes; and
   electrically connecting said exposed portion of each said first electrode with a portion of the adjacent second electrode.

2. A method of manufacturing a photovoltaic device as recited in claim 1, wherein the step of forming said semiconductor film and said second electrode one upon the other includes a step of forming a non-single crystalline semiconductor film.

3. A method of manufacturing a photovoltaic device as recited in claim 2, wherein the step of removing portions of said second electrode includes a step of applying a laser beam to said second electrodes.

4. A method of manufacturing a photovoltaic device as recited in claim 2, wherein the step of removing portions of said second electrode includes a step of applying an electron beam to said second electrode.

5. A method of manufacturing a photovoltaic device as recited in claim 2, wherein the step of removing portions of said second electrode includes a step of applying an ion beam to said second electrode.

6. A method of manufacturing a photovoltaic device as recited in claim 2, wherein the step of dry etching said semiconductor film includes a step of reactive ion etching said semiconductor film.

7. A method of manufacturing a photovoltaic device as recited in claim 2, wherein the step of electrically connecting said exposed portion of a said first electrode with a portion of an adjacent said second electrode includes a step of forming a connecting electrode electrically connected to said adjacent second electrode and the exposed portion of said first electrode.

8. A method of manufacturing a photovoltaic device as recited in claim 7, wherein the step of forming said connecting electrode includes a step of forming a connecting electrode layer over said second electrode and the exposed portion of said first electrode and a step of applying an energy beam to said connecting electrode for removal of portions thereof.

9. A method of manufacturing a photovoltaic device as recited in claim 1, wherein the step of forming said plurality of mutually spaced first electrodes includes a step of forming a first electrode layer on said insulated surface of said substrate and a step of removing by means of an energy beam the portions of said first electrodes corresponding to the gap between adjacent said, photoelectric converting regions.

10. A method of manufacturing a photovoltaic device comprising the steps of:
    preparing a substrate having an insulating surface;
    forming on said insulating surface of said substrate a plurality of mutually spaced first electrodes corresponding to a plurality of photoelectric converting regions;
    forming a non-crystalline semiconductor film and a second electrode continuously covering the entire surface of said plurality of first electrodes one upon the other in this order;
    removing portions of said second electrode by means of an energy beam at least in the vicinities of the gap between adjacent said first electrodes so as to divide said second electrodes into a plurality of portions corresponding to said plurality of photoelectric converting regions;
    removing said semiconductor film by dry etching, using said second electrodes as masks, thereby exposing a portion of each of said first electrodes; and
    electrically connecting said plurality of photoelectric converting regions by forming a connecting electrode electrically connected to each said adjacent second electrode and the exposed portion of each said first electrode.

* * * * *